(12) United States Patent
Glenn

(10) Patent No.: US 10,811,550 B2
(45) Date of Patent: Oct. 20, 2020

(54) SOLAR PANEL SYSTEM

(71) Applicant: Bea Essie Glenn, Oakland, CA (US)

(72) Inventor: Bea Essie Glenn, Oakland, CA (US)

( * ) Notice: Subject to any disclaimer, the term of this patent is extended or adjusted under 35 U.S.C. 154(b) by 179 days.

(21) Appl. No.: 15/560,937

(22) PCT Filed: Mar. 24, 2016

(86) PCT No.: PCT/US2016/024093
§ 371 (c)(1),
(2) Date: Sep. 22, 2017

(87) PCT Pub. No.: WO2016/154480
PCT Pub. Date: Sep. 29, 2016

(65) Prior Publication Data
US 2018/0053864 A1    Feb. 22, 2018

Related U.S. Application Data

(60) Provisional application No. 62/138,311, filed on Mar. 25, 2015.

(51) Int. Cl.
| | | |
|---|---|---|
| H01L 31/042 | (2014.01) | |
| H02S 20/00 | (2014.01) | |
| F24S 50/80 | (2018.01) | |
| H01L 31/054 | (2014.01) | |

(52) U.S. Cl.
CPC ........ H01L 31/042 (2013.01); H01L 31/0547 (2014.12); H02S 20/00 (2013.01); F24S 50/80 (2018.05); *Y02E 10/52* (2013.01)

(58) Field of Classification Search
CPC ... H01L 31/042; H01L 31/0547; H02S 20/00; F24S 50/80

USPC .................................................. 136/242–265
See application file for complete search history.

(56) References Cited

U.S. PATENT DOCUMENTS

| | | | | |
|---|---|---|---|---|
| 4,224,082 | A * | 9/1980 | Jacobson | H02S 40/44 136/248 |
| 8,338,977 | B2 | 12/2012 | Lee et al. | |
| 2005/0103374 | A1* | 5/2005 | Moy | H01L 31/02167 136/246 |
| 2010/0139735 | A1 | 6/2010 | Anderson | |
| 2010/0183443 | A1 | 7/2010 | Thorne | |
| 2015/0130398 | A1* | 5/2015 | Sanese | H02J 7/35 320/101 |

OTHER PUBLICATIONS

International Search Report dated Sep. 2, 2016, for PCT Application No. PCT/US16/24093, filed on Mar. 24, 2016, 4 pages.
Written Opinion dated Sep. 2, 2016, for PCT Application No. PCT/US16/24093, filed on Mar. 24, 2016, 7 pages.
International Preliminary Report on Patentability dated Oct. 5, 2017, for PCT Application No. PCT/US2016/024093, filed on Mar. 24, 2016, 9 pages.

* cited by examiner

*Primary Examiner* — Magali P Slawski
*Assistant Examiner* — Kourtney R S Carlson
(74) *Attorney, Agent, or Firm* — Morrison & Foerster LLP

(57) ABSTRACT

A solar panel system including solar panel units reducing horizontal surface area is provided. The solar panel system may be a cylindrical configuration comprising solar panel units that are configured radially about an internal star-shaped structure.

17 Claims, 18 Drawing Sheets

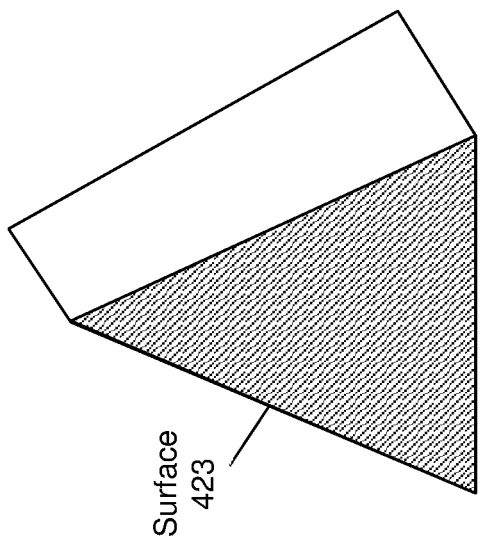

SOLAR PANEL SYSTEM

CROSS-REFERENCE TO RELATED APPLICATIONS

This application is a U.S. national phase application under 35 U.S.C. § 371 of International Application No. PCT/US2016/024093, filed on Mar. 24, 2016, which claims the priority benefit of U.S. Provisional Patent Application No. 62/138,311, filed Mar. 25, 2015, all of which are incorporated herein by reference in their entireties.

FIELD

This disclosure relates generally to a solar panel system that uses renewable energy obtained from sunlight to power an electrical system, and more specifically, to a configuration of a solar panel system that reduces the horizontal surface area needed for operation, alleviates the need for careful positioning of the solar panel system and uses solar energy to power a direct current (DC) or alternating current (AC) to charge a battery to provide electrical power to a DC or AC electrical load.

BACKGROUND

Solar panels can be used for collecting energy from the sun for direct use or storage and often include multiple solar cells mounted securely on a surface. Solar cells are typically made up of photovoltaic material that absorbs photons from the solar energy. The photons strike the photovoltaic surface and transforms the solar energy into electricity, e.g., for commercial or residential applications. Such solar cells are typically arranged to cover a large horizontal surface area. For example, a conventional solar panel system may include solar panels mounted securely on a frame with the photovoltaic surface oriented facing the sun or energy source. In some examples, solar panels may be mounted on a roof or in an array of grids in a field.

There can be certain drawbacks, however, to having the absorbing photovoltaic surface oriented facing the sun or energy source, especially for solar panels having a large horizontal surface area. For example, such a solar panel system can be expensive, heavy, difficult to transport and store, difficult to maintain, difficult to optimally position, and aesthetically unpleasing. Additionally, in conditions where the solar panel system may be shared by several end using devices or need to be in close proximity with other end using devices, it may be beneficial for the solar panel system to be portable. As a result, there remains a need for new and alternative solar panel systems.

BRIEF SUMMARY

The present disclosure provides solar panel systems that have a radial configuration, and may be used in multiple orientations that can reduce the horizontal surface area needed for operation and the need for careful positioning of the system. The solar panel system may be configured in a number of different ways as detailed herein, and may be used while resting on the circular face of the cylinder or while positioned on the side along the body of the cylinder. The solar panel systems described herein may be portable, such as for use on a mobile solar panel system. The solar panel systems described herein can also be configured for larger scale use, such as for use in powering an industrial size generator.

In some aspects, provided is a solar panel system that includes a cylindrical outer casing and a radial support structure, wherein the radial support structure can be connected to a rod and to a cylindrical outer casing; and a ring of solar panel units can be connected to the radial support structure and can optionally be connected to the cylindrical outer casing.

In one aspect, provided is a solar panel system that includes:

a plurality of solar panel units radially configured around a rod, wherein each solar panel unit has at least one solar cell and wherein each solar panel unit has a vertical orientation; and at least one cylindrical outer casing, wherein each of the at least one cylindrical outer casing contacts each solar panel unit of the plurality of solar panel units and is configured to maintain a space between each solar panel unit of the plurality of solar panel units.

In another aspect, provided is a solar panel system that includes:

a plurality of solar panel units radially configured around a rod, wherein each solar panel unit has at least one solar cell; and at least one cylindrical outer casing, wherein each of the at east one cylindrical outer casing contacts each solar panel unit of the plurality of solar panel units and is configured to maintain a space between each solar panel unit of the plurality of solar panel units. In some examples, each solar panel unit has a vertical orientation.

In another aspect, provided is a solar panel system that includes:

a plurality of solar panel units, wherein each solar panel unit has at least one solar cell and wherein each solar panel unit has a vertical orientation;

a radial support structure comprising a plurality of support panels and a rod, wherein the plurality of support panels are radially configured around the rod, and wherein the plurality of solar panel units are mounted onto the plurality of support panels; and at least one cylindrical outer casing, wherein each of the at least one cylindrical outer casing contacts each support panel of the radial support structure and wherein the cylindrical. outer casing is configured to maintain a space between each support panel of the radial support structure.

In another aspect, provided is a solar panel system that includes:

a plurality of solar panel units, wherein each solar panel unit has at least one solar cell;

a radial support structure comprising a plurality of support panels and a rod, wherein the plurality of support panels are radially configured around the rod, and wherein the plurality of solar panel units are mounted onto the plurality of support panels; and at least one cylindrical outer casing, wherein each of the at least one cylindrical outer casing contacts each support panel of the radial support structure and wherein the cylindrical outer casing is configured to maintain a space between each support panel of the radial support structure. In some examples, each solar panel unit has a vertical orientation.

In yet another aspect, provided is a solar panel system that includes:

a plurality of solar panel units, wherein each solar panel unit has at least one solar cell and a prism support structure, and wherein at least one solar cell is mounted on one surface of the prism support structure;

a radial support structure comprising a plurality of support panels and a rod, wherein the plurality of support panels are radially configured around the rod, and wherein the plurality of solar panel units are mounted onto the plurality of support panels;

at least one cylindrical outer casing;

wherein the plurality of solar panel units are arranged around the radial support structure, and wherein the at least one cylindrical outer casing is configured to support the arrangement of the plurality of solar panel units around the radial support structure.

In an additional aspect, provided is a solar panel system that includes:

a first solar panel unit and a second solar panel unit radially configured around a rod, wherein the first solar panel unit comprises a first solar cell and the second solar panel unit comprises a second solar cell and wherein the first solar panel it and the second solar panel unit have a vertical orientation; and a first cylindrical outer casing, wherein the first cylindrical outer casing contacts the first solar panel unit and the second solar panel unit and is configured to maintain a space between the first solar panel unit and the second solar panel unit.

In an additional aspect, provided is a solar panel system that includes:

a first solar panel unit and a second solar panel unit radially configured around a rod, wherein the first solar panel unit comprises a first solar cell and the second solar panel unit comprises a second solar cell; and a first cylindrical outer casing, wherein the first cylindrical outer casing contacts the first solar panel unit and the second solar panel unit and is configured to maintain a space between the first solar panel unit and the second solar panel unit. In some examples, the first solar panel unit and the second solar panel unit have a vertical orientation.

In another additional aspect, provided is a solar panel system that includes:

a first solar panel unit and a second solar panel unit radially configured around a rod, wherein the first solar panel unit comprises a first solar cell and the second solar panel unit comprises a second solar cell and wherein the first solar panel unit and the second solar panel unit have a vertical orientation;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel; and a first cylindrical outer casing, wherein the cylindrical outer casing contacts the first support panel and the second support panel of the radial support structure and wherein the cylindrical outer casing is configured to maintain a space between the first support panel and the second support panel of the radial support structure.

In another additional aspect, provided is a solar panel system that includes:

a first solar panel unit and a second solar panel unit radially configured around a rod, wherein the first solar panel unit comprises a first solar cell and the second solar panel unit comprises a second solar cell;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel; and a first cylindrical outer casing, wherein the cylindrical outer casing contacts the first support panel and the second support panel of the radial support structure and wherein the cylindrical outer casing is configured to maintain a space between the first support panel and the second support panel of the radial support structure. In some examples, the first solar panel unit and the second solar panel unit have a vertical orientation.

In yet another additional aspect, provided is a solar panel system that includes:

a first solar panel unit and a second solar panel unit, wherein the first solar panel unit comprises a first solar cell and a first prism support structure, the second solar panel unit comprises a second solar cell and a second prism support structure, and wherein the first solar cell is mounted on one surface of the first prism support structure and the second solar cell is mounted on one surface of the second prism support structure;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel;

a first cylindrical outer casing;

wherein the first solar panel unit and the second solar panel unit are arranged around the radial support structure, and wherein the first cylindrical outer casing is configured to support the arrangement of the first solar panel unit and the second solar panel unit around the radial support structure.

BRIEF DESCRIPTION OF THE FIGURES

The present application can be understood by reference to the following description taken in conjunction with the accompanying figures.

FIG. 4A illustrates an exemplary triangular-shaped solar cell.

DETAILED DESCRIPTION

Figure 1A:
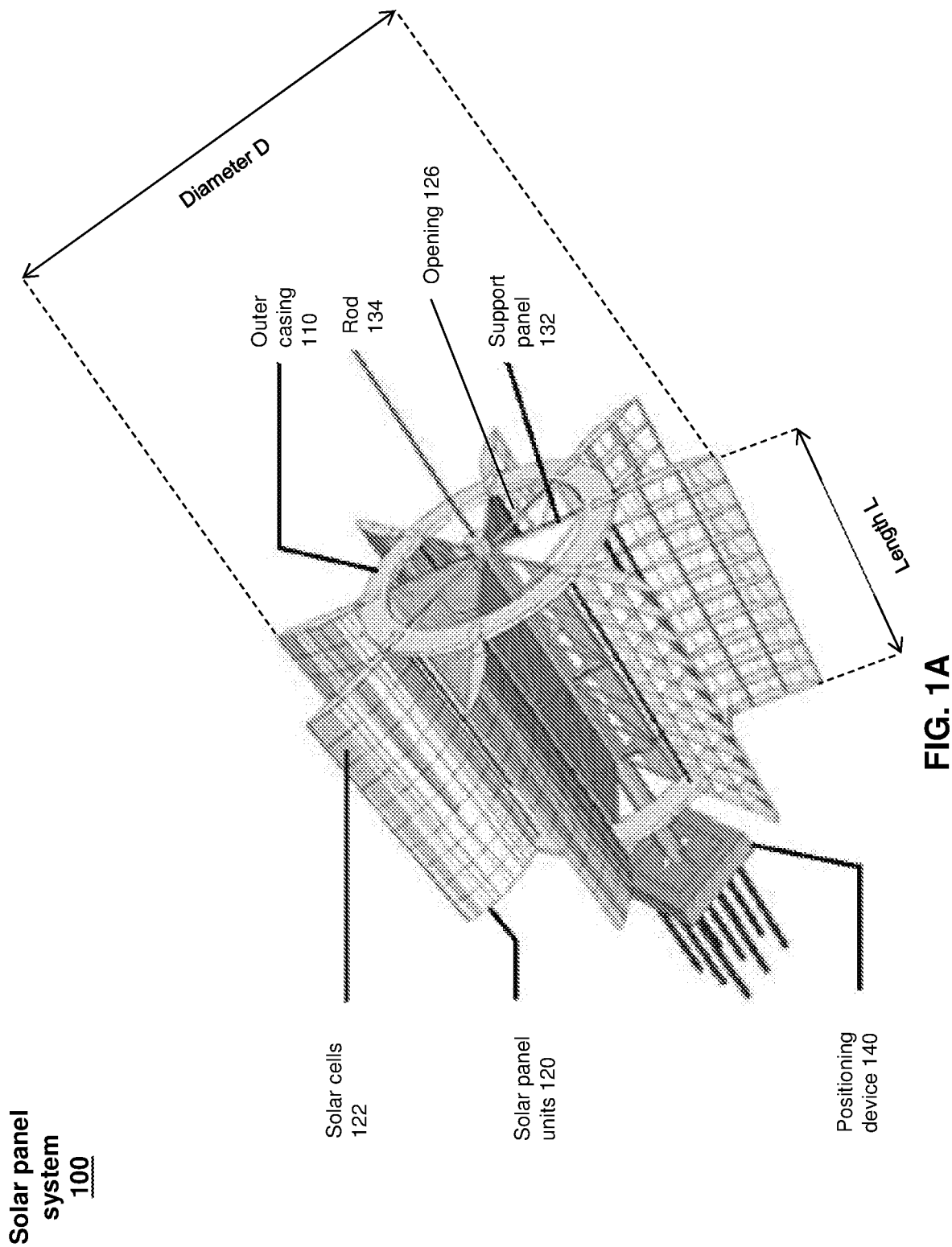
FIG. 1A illustrates an exemplary solar panel system.

The following description is presented to enable a person of ordinary skill in the art to make and use the various examples. Descriptions of specific devices, techniques, and applications are provided only as examples. Various modifications to the examples described herein will be readily apparent to those of ordinary skill in the art, and the general principles defined herein may be applied to some examples and applications without departing from the spirit and scope of the present technology. Thus, the disclosed technology is not intended to be limited to the examples described herein and shown, but is to be accorded the scope consistent with the claims.

Provided herein are solar panel systems suitable for use in a variety of applications, including, for example, remote area power, emergency power, disaster relief, back-up power, military, residential, medical equipment, water purification, water pumping, stationary refrigeration, mobile refrigeration, computer systems, communication systems, remote satellite up-link systems, battery charging, engine generators, uninterruptible power supply (UPS) system charging and power tools. In some examples, the solar panel systems provided herein may be used to charge a UPS system. UPS systems, e.g., battery back-up, flywheel back-up, supercapacitors, or compressed air generators, are designed to provide emergency power to a load when the grid power input fails. The solar panel system can be used to power the aforementioned applications either fully or in-part.

In some examples, having to transport energy to remote or secluded locations may not be cost effective, for example, in the case of small-scale applications. Thus, by being able to locate the solar panel system in proximity to the end device that the solar panel system is powering (e.g., appliances), the costs of electricity distribution infrastructure can be reduced. Moreover, energy losses due to transmission and transportation over long distances can be reduced. The solar panel systems detailed herein can be scaled up and multiple systems may be connected together in order to operate on a large industrial scale, such as for utility scale power plants.

The solar panel systems detailed herein can be used continuously or intermittently, and can be connected or not to the main utility power grid. The solar panel system can also be connected to battery banks (e.g., in order to provide power when sunlight conditions are non-optimal or at night). The solar panel system may also comprise one or more solar inverters. Moreover, in order to obtain maximum efficiency, the solar panel can be connected to a sun-tracking device. A person of ordinary skill in the art will easily recognize that battery banks, solar inverters and sun-tracking devices are well-known technologies that can be used in conjunction with the solar panel system detailed herein. The solar panel system described herein is used to produce a direct current (DC) or alternating current (AC) in order to charge a battery to provide electrical power to a DC or AC electrical load.

The configurations for the solar panel systems described herein may reduce the horizontal surface area needed to mount the solar panel system as compared to traditional solar panel systems without compromising collection efficiency. The exemplary configurations detailed herein thus may reduce the need for solar panel grids that require large amounts of horizontal space. The solar panel systems described herein may find particular use in circumstances where there is limited space or sunlight, or where portability of the solar panel system can be an important factor. The solar panel systems can have a cylindrical outer casing to help maintain the vertical configuration of the solar cells, thereby allowing the solar panel system to be portable. Different configurations of solar cells may be used, which may allow for a larger number of solar cells to be present per square foot of horizontal space as compared to traditional solar panel systems using a horizontal solar panel configuration.

Various configurations for solar panel systems are described herein. For example, in one aspect, provided is a solar panel system that includes: a plurality of solar panel units radially configured around a rod, wherein each solar panel unit has at least one solar cell and wherein each solar panel unit has a vertical orientation; and at least one cylindrical outer casing, wherein each of the at least one cylindrical outer casing contacts each solar panel unit of the plurality of solar panel units and is configured to maintain a space between each solar panel unit of the plurality of solar panel units.

In another aspect, provided is a solar panel system that includes: a plurality of solar panel units radially configured around a rod, wherein each solar panel unit has at least one solar cell; and at least one cylindrical outer casing, wherein each of the at least one cylindrical outer casing contacts each solar panel unit of the plurality of solar panel units and is configured to maintain a space between each solar panel unit of the plurality of solar panel units. In some examples, each solar panel unit has a vertical orientation.

In another aspect, provided is a solar panel system that includes: a plurality of solar panel units, wherein each solar panel unit has at least one solar cell and wherein each solar panel unit has a vertical orientation; a radial support structure comprising a plurality of support panels and a rod, wherein the plurality of support panels are radially configured around the rod, and wherein the plurality of solar panel units are mounted onto the plurality of support panels; and at least one cylindrical outer casing, wherein each of the at least one cylindrical outer casing contacts each support panel of the radial support structure and wherein the cylindrical outer casing is configured to maintain a space between each support panel of the radial support structure.

In another aspect, provided is a solar panel system that includes: a plurality of solar panel units, wherein each solar panel unit has at least one solar cell; a radial support structure comprising a plurality of support panels and a rod, wherein the plurality of support panels are radially configured around the rod, and wherein the plurality of solar panel units are mounted onto the plurality of support panels; and at least one cylindrical outer casing, wherein each of the at least one cylindrical outer casing contacts each support panel of the radial support structure and wherein the cylindrical outer casing is configured to maintain a space between each support panel of the radial support structure. In some examples, each solar panel unit has a vertical orientation.

FIG. 1A illustrates an exemplary solar panel system. Solar panel system 100 can include a plurality of solar panel units 120, a plurality of cylindrical outer casings 110, and a rod 134. Plurality of solar panel units can be supported by, attached to, or held together by the plurality (e.g., two) of cylindrical outer casings 110. Each solar panel unit 120 can include plurality of solar cells 122. Solar cells 122 can be any type of solar cells including, but not limited to, silicon-based (e.g., single crystal silicon or poly-crystalline silicon) solar cells or thin film solar cells (i.e., solar cell comprising a plurality of layers of one or more thin film photovoltaic materials). Each solar cell 122 can have one or more electrical connections, where the generated electricity can be drawn. In some examples, solar cells 122 can be electrically connected together to form solar panel unit 120. In some examples, solar cells 122 can be electrically coupled together using one or more switches or a switching matrix (not shown). In some examples, the one or more switches or switching matrix can be included, in part or entirely, in support panels 132, cylindrical outer casings 110, rod 134, or a combination thereof.

The solar panel unit can further include support panels 132 that can provide structural support or a surface to mount solar cells 122. In some examples, solar cells 122 can be supported by a substrate. In some examples, the substrate can be a single substrate that the solar cells are formed on. In some examples, the support can include multiple substrates coupled or adhered together. In some examples, the substrate can include a transparent material, such as a glass, plastic, or PET. A transparent material can allow light that is not absorbed by one solar cell 122 to be absorbed by other solar cells 122. In some examples, the substrate can include a reflective material, such as aluminum or silver, to reflect, redirect, focus, and/or concentrate the light incident on the surface of the solar cells 122.

In some examples, plurality of solar cells 122 can be oriented such that the absorbing surfaces of plurality of solar cells 122 are substantially parallel to the sun. In some examples, one or more solar panel units can have at least one curved surface. In some examples, the curved surface can be used to increase the number of light rays from the sun incident on the surface. In some examples, the curved surface can be used for aesthetic purposes. In some examples, the curved surface can be convex, as shown in the figure. In some examples, the curved surface can be concave (not shown). In some examples, one or more solar panel units can include a plurality of solar cells 122 located on one side of the solar panel unit. In some examples, one or more solar panel units can include a plurality of solar cells 122 located on both sides of the solar panel unit.

Cylindrical outer casing 110 can be connected to a radial support structure comprising support panels 132 and rod 134. Support panels 132 can each be connected to rod 134, and cylindrical outer casing 110 can optionally include one or more notches or attachment locations to hold support panels 132 in a radial configuration around rod 134. In some examples, cylindrical outer casing 110 can be connected to rod 134. Support panels 132 can be connected to rod 134 such that a plurality of openings 126 can be formed. Plurality of openings 126 can be configured such that light rays from the sun can enter through plurality of openings 126 and can travel to reach the absorbing surfaces of plurality of solar cells 122.

Rod 134 can also be connected to a grounding, holding, or positioning device 140. In some examples, rod 134 can be used to route electrical connections or wires from the plurality of solar cells 122 to a generator, power supply, battery, end-device, or the like. In some examples, additionally or alternatively, cylindrical outer casing 110 can be used to route electrical connections or wires from the plurality of solar cells 122. In some examples, additionally or alternatively, one or more support panels 132 can be used to route electrical connections or wires from the plurality of solar cells 122.

Solar panel system 100 can be mounted or configured such that at least one cylindrical outer casing 110 is oriented directly facing the sun. As a result, the horizontal space occupied by solar panel system 100 can be reduced when the total absorbing surface area (i.e., length L multiplied by width of the solar cells) of solar panel units is greater than the footprint (i.e., π multiplied by the diameter D of solar panel system 100). In this manner, the footprint of the solar panel system can be reduced without compromising efficiency and/or amount of collected light rays. In some examples, positioning device 140 can be configured to rotate solar panel system 100. Positioning device 140 can include or can be coupled to a processor or controller. The processor or controller can rotate solar panel system 100 to exchange solar panel units.

In yet another aspect, provided is a solar panel system that includes: a plurality of solar panel units, wherein each solar panel unit has at least one solar cell and a prism support structure, and wherein at least one solar cell is mounted on one surface of the prism support structure; a radial support structure; a cylindrical outer casing; wherein the plurality of solar panel units are arranged around the radial support structure, and wherein the cylindrical outer casing is configured to support the arrangement of the plurality of solar panel units around the radial support structure.

Figure 1B:
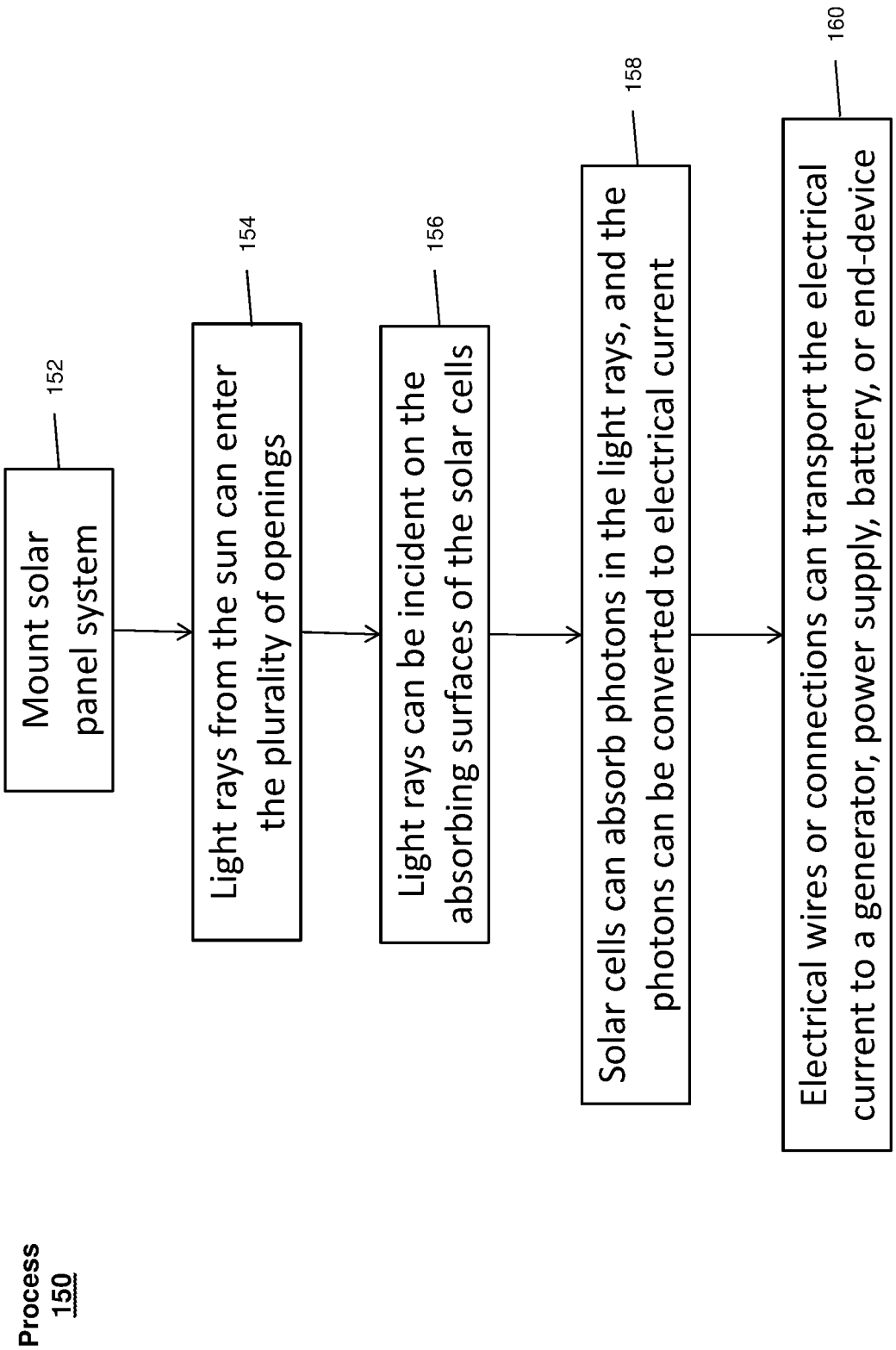
FIG. 1B illustrates an exemplary process flow for operating the solar panel system.

FIG. 1B illustrates an exemplary process flow for operation of a solar panel system. Solar panel system 100 can be mounted such that at least one cylindrical outer casing 110 is oriented directly facing the sun (step 152 of process 150). Light rays from the sun can enter plurality of openings 126 (step 154 of process 150). Light rays can be incident on absorbing surfaces of plurality of solar cells 122 (step 156 of process 150). Plurality of solar cells 122 can absorb photons included in the light rays, and the photons can be converted to an electrical current (step 158 of process 150). Electrical wires, electrical connections, or bus bars coupled to plurality of solar cells 122 can transport the electrical current to a generator, power supply, battery, end-device, or the like (step 160 of process 150).

Figure 2A:
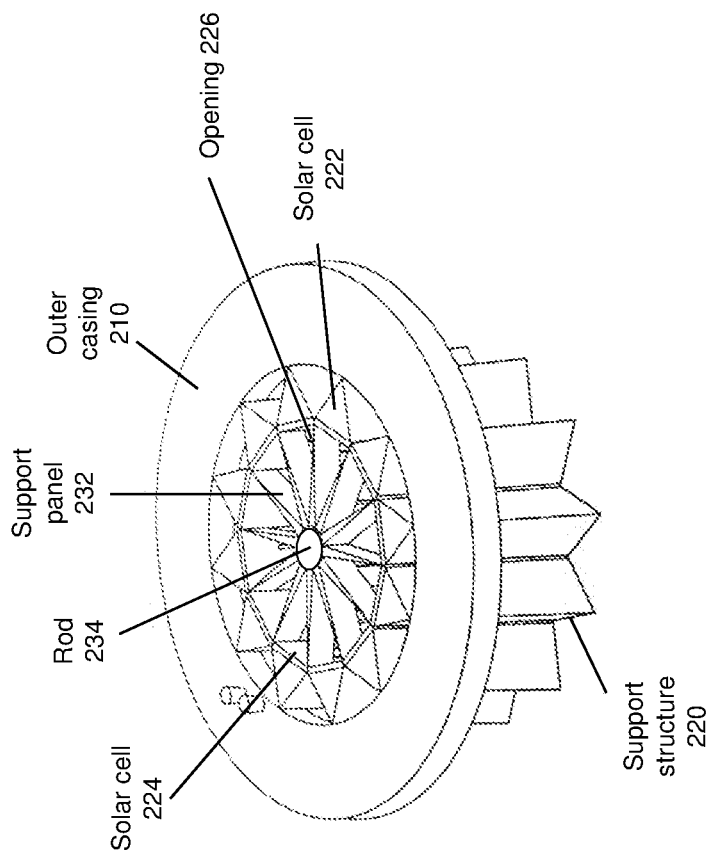
FIGS. 2A-2C illustrate exemplary solar panel systems.

FIG. 2A illustrates an exemplary solar panel system. Solar panel system 200 can include one or more cylindrical outer casings 210, rod 234, and a plurality of prism support structures 220. Solar panel system 200 can include a plurality of solar panel units, where each solar panel unit can comprise a plurality of solar cells, such as plurality of triangular-shaped solar cells 222 and plurality of rectangular-shaped solar cells 224. Triangular-shaped solar cells 222 and rectangular-shaped solar cells 224 can be any type of solar cell including, but not limited to, silicon-based (e.g., single crystal silicon or polycrystalline silicon) solar cells or thin film solar cells (i.e., solar cells comprising a plurality of layers of one or more thin film photovoltaic materials). Triangular-shaped solar cells 222 and/or rectangular-shaped solar cells 224 can be supported by prism support structures 220. Triangular-shaped solar cells 222 and rectangular-shaped solar cells 224 can be located on any side (or more than one side) of prism support structures 220. In some examples, solar panel system 200 can be mounted such that the absorbing surfaces of triangular-shaped solar cells 222 are oriented directly facing the sun and absorbing surfaces of rectangular-shaped solar cells 224 are oriented facing rod 234.

In some examples, support structure 220 can be prism-shaped. Support structures 220 can be supported by or attached to cylindrical outer casing 210. In some examples, support structures 220 can be supported by or attached to support panels 232. Support structures 220 can be formed by one or more substrates. In some examples, support structures 220 can include reflective material, such as aluminum or silver, configured to reflect, redirect, focus, and/or concentrate light incident on the absorbing surface of solar cells 224. In some examples, the solar panel units can be connected to a star-shaped radial support structure that is made up of support panels 232 and a rod 234 and can form plurality of openings 226. In some examples, the star-shaped radial support structure can include reflective material.

Each solar cell can have one or more electrical connections, where the generated electricity can be drawn. In some examples, triangular-shaped solar cells 222 and/or rectangular-shaped solar cells 224 can include a plurality of solar cells, where one or more solar cells can be electrically connected together. In some examples, the solar cells can be electrically coupled together using one or more switches or a switching matrix (not shown). In some examples, the one or more switches or switching matrix can be included, in part or entirely, in support panels 232, one or more cylindrical outer casing 210, rod 234, prism support structures 220, or a combination thereof.

In some examples, cylindrical outer casing 210 can be configured to provide support, attach to, or hold together the plurality of solar panel units, where the cylindrical outer casing 210 can encase a ring of solar panel units consisting of triangular-shaped solar cells 222 and rectangular-shaped solar cells 224 connected to a plurality of triangular prism support structures 220. In some examples, solar panel system 200 can include two cylindrical outer casings 210 used and configured such that each of these cylindrical outer casings 210 can be placed at one end of solar panel system 200. In some examples, cylindrical outer casing 210 can be configured to provide support to or include one or more solar cells.

Figure 2B:
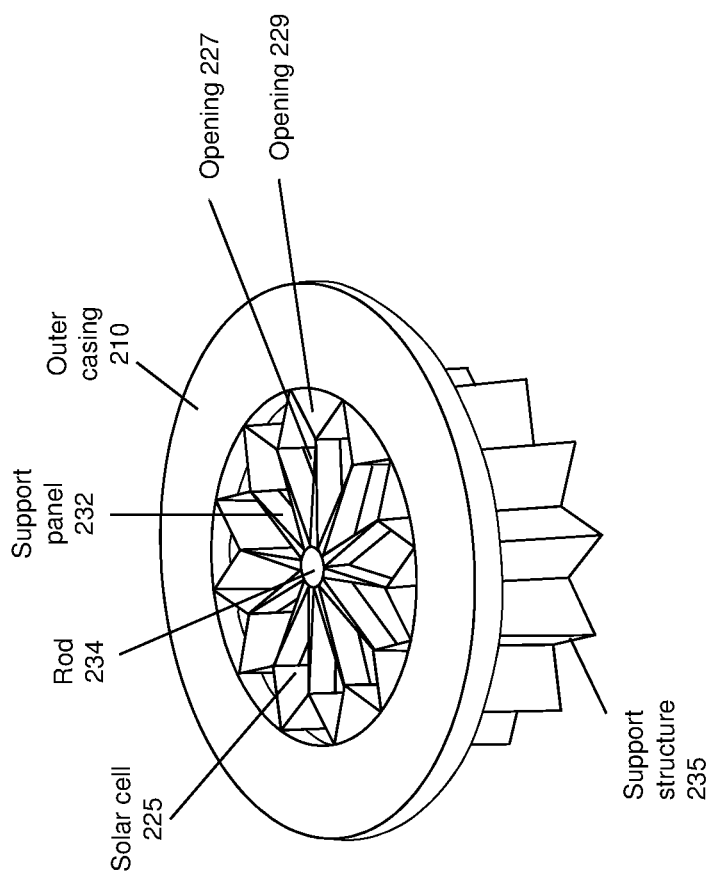

In some examples, the solar panel system can include support structures configured with any shape, such as v-shaped support structures included in solar panel system 250 as illustrated in FIG. 2B. Solar cells 225 can be mounted on the inner faces of the v-shaped support structures 235 with the absorbing surfaces of the solar cells 225 facing rod 234. System 250 can be configured with one or more openings, such as opening 227 and opening 229. Solar panel system 250 can optionally include supports (not shown). The supports can be configured to support or attach the v-shaped support structures 235 to one or more star-shaped radial support structures. In some examples, the supports can include a transparent material. For example, the supports can be a glass, plastic, or PET substrate.

Figure 2C:
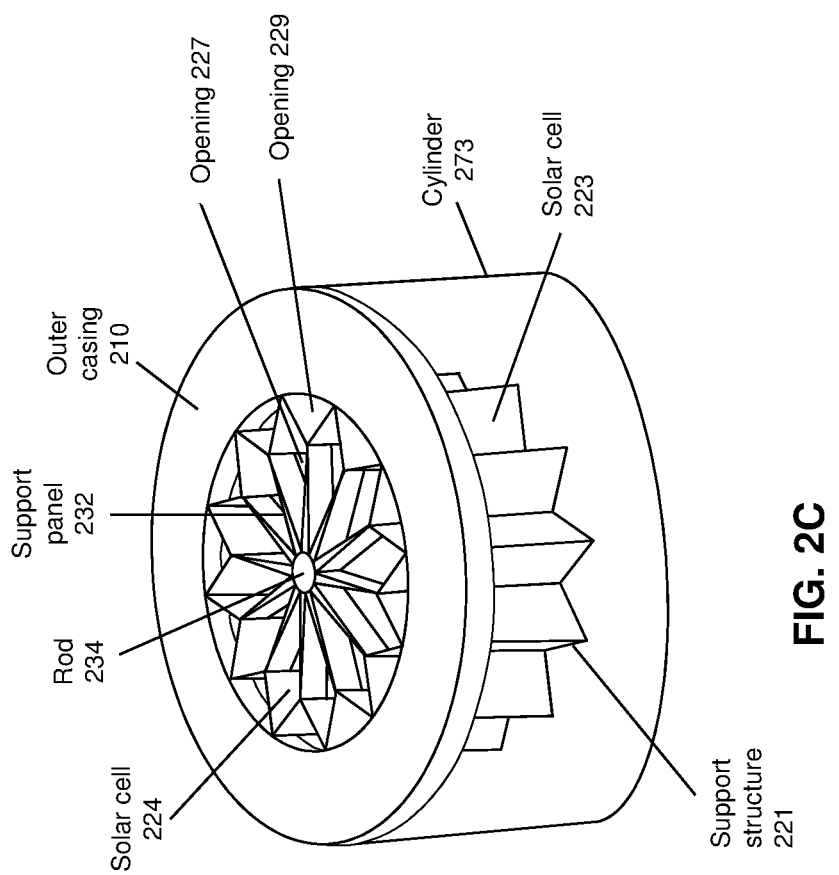

In some examples, the solar panel system can be partially enclosed, as illustrated in solar panel system 270 in FIG. 2C. Solar panel system 270 can include a hollow cylinder 273 enclosing the of solar panel units. Cylinder 273 can be supported by or attached to one or more cylindrical outer casings 210. Cylinder 273 can include an inner face that faces inward (e.g., faces rod 234). In some examples, solar panel system 270 can include support structure 221. Support structure 221 can be prism support structure (e.g., support structure 220 illustrated in FIG. 2A or support structure 520 illustrated in FIG. 5A) with openings 229 located between support structures 221, and solar cells can be located on any or all of the three sides of the support structure 221. In some examples, support structure 221 can be a v-shaped support structure (e.g., support structure 521 illustrated in FIG. 5B). The inner face of cylinder 273 can include a reflective material configured to reflect, redirect, focus, and/or concentrate incident light onto the absorbing surfaces of the solar cells 224. For example, light from the sun can enter in openings 227, and solar cells can be located on support structure 221 with the absorbing surfaces of the solar cells 223 facing the inner face of cylinder 273. A portion of light from the sun can be absorbed directly by the solar cells, and a portion of light from the sun can be incident on inner face of cylinder 273. The reflective material of inner face of cylinder 273 can reflect and redirect the light towards the absorbing surfaces of the solar cells 223 located on support structure 221. In some examples, inner face of cylinder 273 can include solar cells.

In some examples, solar panel system 270 can include openings 227 formed by support panels 232 and rectangular-shaped solar cells 224. Light from the sun can, additionally or alternatively, enter openings 227 and can be absorbed by rectangular-shaped solar cells 224. Rectangular-shaped solar cells 224 can be attached to or supported by v-shaped support structures 221 with solar cells located on the inner faces (similar to solar panel system 250 illustrated in FIG. 2B).

In some examples, the solar panel units can have a vertical orientation. In some examples when a solar panel unit has a vertical orientation, the solar panel unit can be configured such that the absorbing surfaces of the solar cells are oriented substantially perpendicular to the plane of the cylindrical outer casing 210.

In another aspect, provided is a solar panel system that includes:

a first solar panel unit and a second solar panel unit radially configured around a rod, wherein the first solar panel unit comprises a first solar cell and the second solar panel unit comprises a second solar cell and wherein the first solar panel unit and the second solar panel unit have a vertical orientation; and a first cylindrical outer casing, wherein the first cylindrical outer casing contacts the first solar panel unit and the second solar panel unit and is configured to maintain a space between the first solar panel unit and the second solar panel unit.

In another aspect, provided is a solar panel system that includes:

a first solar panel unit and a second solar panel unit radially configured around a rod, wherein the first solar panel unit comprises a first solar cell and the second solar panel unit comprises a second solar cell and wherein the first solar panel unit; and a first cylindrical outer casing, wherein the first cylindrical outer casing contacts the first solar panel unit and the second solar panel unit and is configured to maintain a space between the first solar panel unit and the second solar panel unit. In some examples, the first solar panel unit and the second solar panel unit have a vertical orientation.

In another additional aspect, provided is a solar panel system that includes:

a first solar panel unit and a second solar panel unit radially configured around a rod, wherein the first solar panel unit comprises a first solar cell and the second solar panel unit comprises a second solar cell and wherein the first solar panel unit and the second solar panel unit have a vertical orientation;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel; and a first cylindrical outer casing, wherein the cylindrical outer casing contacts the first support panel and the second support panel of the radial support structure and wherein the cylindrical outer casing is configured to maintain a space between the first support panel and the second support panel of the radial support structure.

In another additional aspect, provided is a solar panel system that includes:

a first solar panel unit and a second solar panel unit radially configured around a rod, wherein the first solar panel unit comprises a first solar cell and the second solar panel unit comprises a second solar cell;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel; and a first cylindrical outer casing, wherein the cylindrical outer casing contacts the first support panel and the second support panel of the radial support structure and wherein the cylindrical outer casing is configured to maintain a space between the first support panel and the second support panel of the radial support structure. In some examples, the first solar panel unit and the second solar panel unit have a vertical orientation.

In yet another additional aspect, provided is a solar panel system that includes:

a first solar panel unit and a second solar panel unit, wherein the first solar panel unit comprises a first solar cell and a first prism support structure, the second solar panel unit comprises a second solar cell and a second prism support structure, and wherein the first solar cell is mounted on one surface of the first prism support structure and the second solar cell is mounted on one surface of the second prism support structure;

a radial support structure comprising a first support panel, a second support panel and a rod, wherein the first support panel and the second support panel are radially configured around the rod, and wherein the first solar panel unit is mounted onto the first support panel and the second solar panel unit is mounted onto the second support panel;

a first cylindrical outer casing;

wherein the first solar panel unit and the second solar panel unit are arranged around the radial support structure, and wherein the first cylindrical outer casing is configured to support the arrangement of the first solar panel unit and the second solar panel unit around the radial support structure.

The parts of the solar systems provided herein are discussed in further detail below.

Solar Panel Unit

The solar panel units in the systems described herein includes at least one solar cell. In some examples, each solar panel unit can include at least one solar cell and a support structure. In some examples, the solar panel units can be located radially around the long axis of the rod. In some examples, the solar panel units can be located perpendicular to the long axis of the rod. In some examples, the solar panel units can be located along the long axis of the rod. In some examples, the solar panel units can be located at any angle with respect to the long axis of the rod. In other examples, the solar panel units can be configured perpendicular to the long axis of the rod, configured along the long axis of the rod, configured at any angle with respect to the long axis of the rod, or any combination thereof.

In some examples, the solar panel units can be circumscribed within the volume defined by the outer radius of the at least one cylindrical outer casing. In some examples, the solar panel units are protruding out of the volume defined by the outer radius of the at least one cylindrical outer casing.

Figure 3A:
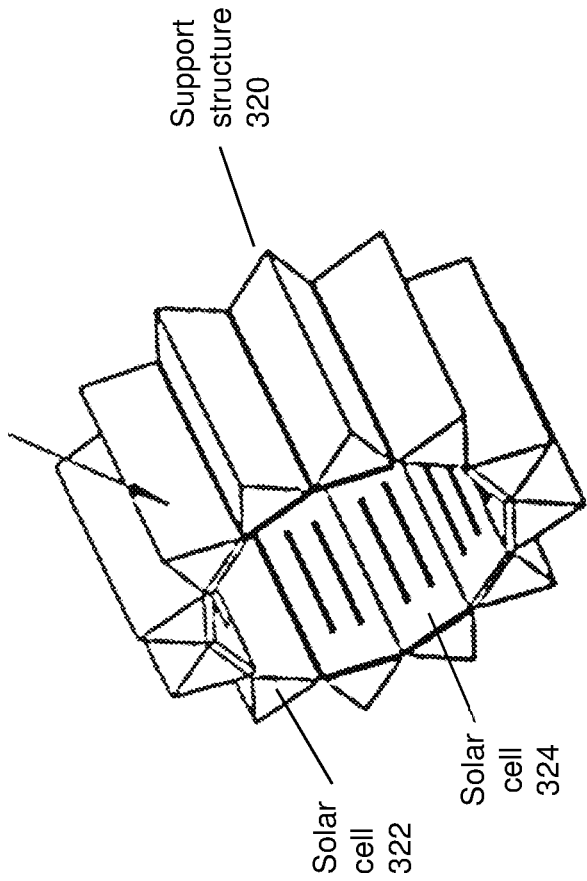
FIGS. 3A-3B illustrate exemplary pluralities of solar panel units.

FIG. 3A illustrates an exemplary structure including a plurality of solar panel units arranged in a ring configuration. Plurality of solar panel units 304 can include a plurality of support structures 320. In some examples, each solar panel unit 304 can include at least one solar cell, such as solar cell 322 and/or solar cell 324, and a support structure, such as support structure 320. In some examples, solar cell 322 can be a triangular-shaped solar cell, solar cell 324 can be a rectangular-shaped solar cell, and support structure 320 can be a triangular prism support structure. Support structure 320 can be configured to support the solar cells(s), or solar cell(s) may be mounted on at least one surface of support structure 320. In some examples, solar cell 322 can be connected or mounted to the triangular face of triangular prism support structure 320. In some examples, solar panel units 304 can include a plurality of solar cells of different shapes, such as triangular and rectangular-shaped solar cells. In some examples, plurality of solar panel units 304 can, additionally or alternatively, include rectangular solar cells 324 connected or mounted to the internal rectangular faces of triangular prism support structure 320. In some examples, solar cells 324 can be configured such that the absorbing surfaces of the solar cells 324 can be facing the center of the plurality of solar panel units 304. In some examples, the solar cell(s) may be mounted on other faces of the triangular prism structure.

Figure 5A:
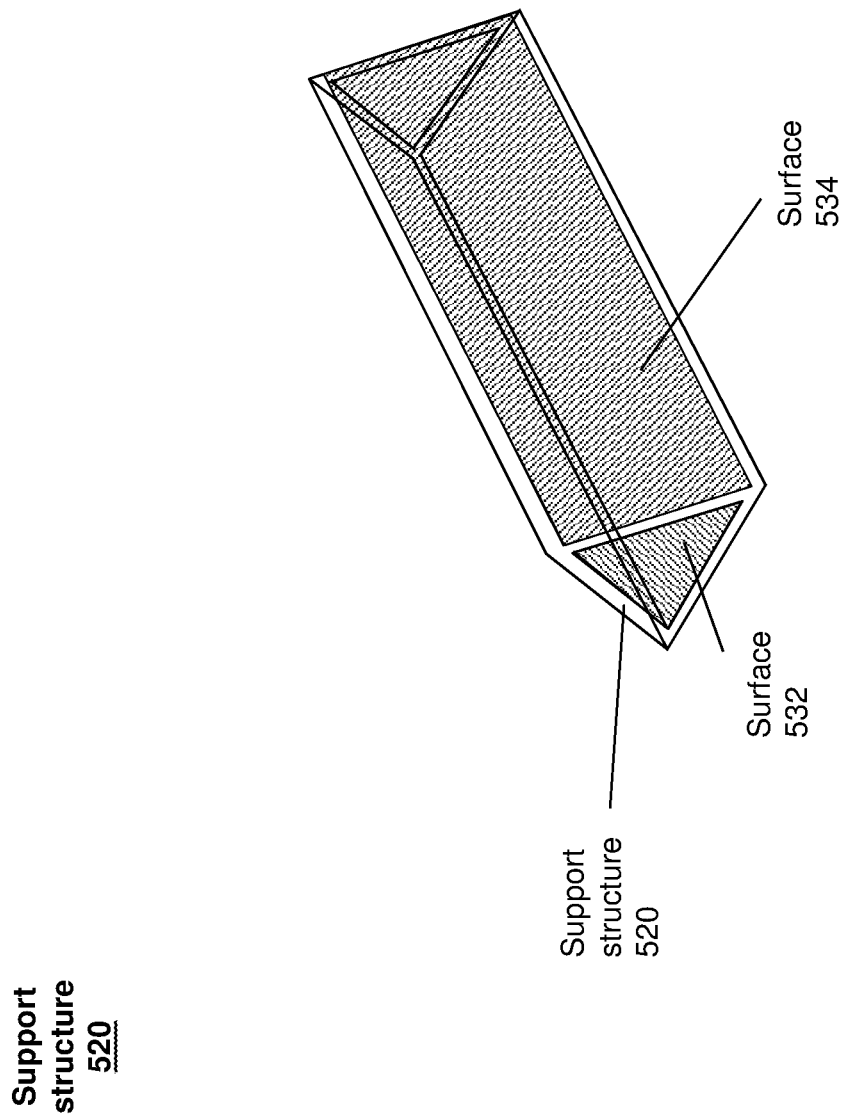
FIGS. 5A-5B illustrate exemplary support structures.
Figure 6B:
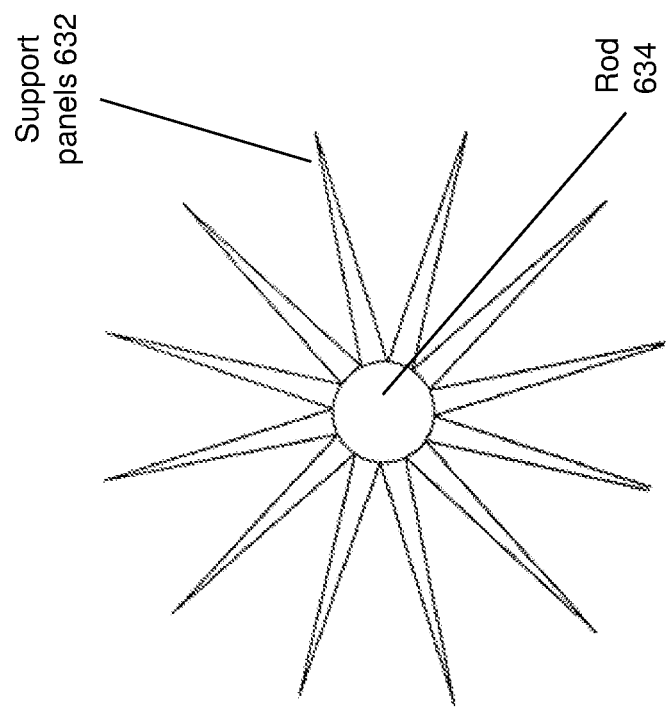
FIG. 6B illustrates an exemplary radial support structure.

The exemplary solar panel units depicted in FIG. 3A may be connected to a radial support structure (e.g., radial support structure 630 illustrated in FIG. 6B). Plurality of support structures 320 may be configured radially around the long axis of a rod (e.g., rod 634 illustrated in FIG. 6B). Support structures 320 can be any shape including, but not limited to, triangular prisms (e.g., triangular support structure 520 illustrated FIG. 5A).

Support structures 320 can include any type of conductive material configured to dissipate built-in heat accumulated by solar cells 322, solar cells 324, or both. In some examples, support structures 320 can include any type of reflective material configured to focus, redirect, collect, and/or concentrate light. in some examples, support structures 320 can include a transparent material, such as glass or plastic. Support structures 320 can also be used to filter one or more bands of wavelengths of light reaching the solar cells such that the solar cells are configured to absorb only certain wavelengths of light. In some examples, support structures 320 can include one or more slits to filter wavelengths of light. In some examples, support structures can include one or more thin film layers to filter wavelengths of light.

Figure 3B:
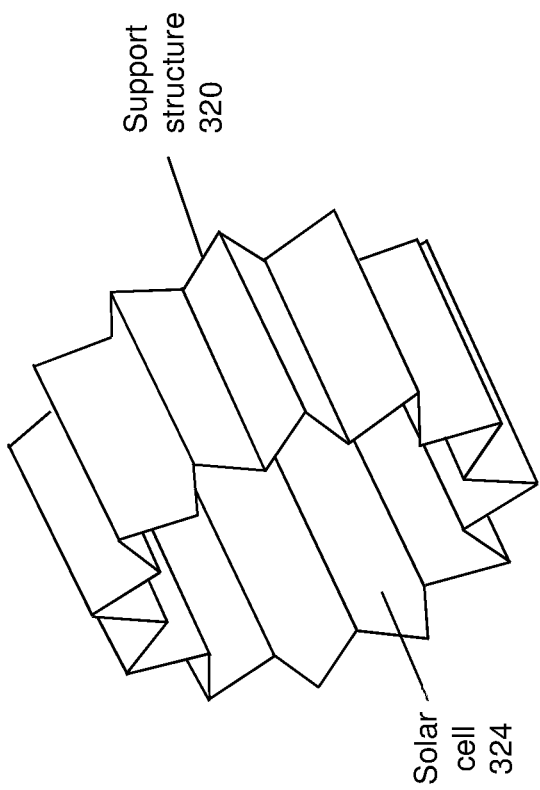

FIG. 3B illustrates an exemplary structure including a plurality of solar panel units arranged in a ring configuration. Plurality of solar panel units 304 can include a plurality of support structures 320. In some examples, each solar panel unit 304 can include at least one solar cell, such as solar cell 324, and a support structure, such as support structure 320. In some examples, solar cell 324 can be a rectangular-shaped solar cell, and support structure 320 can be a v-shaped support structure (e.g., support structure 521 illustrated in FIG. 5B). Support structure 320 can be configured to support the solar cells(s), or solar cell(s) may be mounted on at least one surface of support structure 320. In some examples, plurality of solar panel units 304 can include rectangular solar cells 324 connected or mounted to the internal rectangular faces of v-shaped support structure 320. In some examples, solar cells 324 can be configured such that the absorbing surfaces of the solar cells 324 can be facing the center of the plurality of solar panel units 304. In some examples, the solar cell(s) may be mounted on other faces of the triangular prism structure.

The exemplary solar panel units depicted in FIG. 3B may be connected to a radial support structure (e.g., radial support structure 630 illustrated in FIG. 6B). Plurality of support structures 320 may be configured radially around the long axis of a rod (e.g., rod 634 illustrated in FIG. 6B).

Support structures 320 can include any type of conductive material configured to dissipate built-in heat accumulated by solar cells 324. In some examples, support structures 320 can include any type of reflective material configured to focus, redirect, collect, and/or concentrate light. In some examples, support structures 320 can include a transparent material, such as glass or plastic. Support structures 320 can also be used to filter one or more bands of wavelengths of light reaching the solar cells such that the solar cells are configured to absorb only certain wavelengths of light. In some examples, support structures 320 can include one or more slits to filter wavelengths of light. In some examples, support structures can include one or more thin film layers to filter wavelengths of light.

a) Solar Cells

In some examples, at least one of the solar cells is flat. In some examples, at least one of the solar cells is curved.

Examples of the disclosure can include any type and/or shape of solar cells. FIG. 4A illustrates an exemplary triangular-shaped solar cell. Solar cell 422 can include surface 423, where one or more photovoltaic materials can be disposed on. The one or more photovoltaic materials can be configured to absorb sunlight and convert the absorbed light into electricity. Solar cell 422 can be any type of solar cell including, but not limited to, silicon-based (e.g., single crystal silicon or polycrystalline silicon) solar cells or thin film solar cells (i.e., solar cells comprising a plurality of layers of one or more thin film photovoltaic materials). In some examples, solar cells 422 can be mounted to one or both of the triangular faces of a support structure (e.g., triangular face(s) of support structure 320 illustrated in FIG. 3A or triangular face(s) of surface 532 of support structure 520 illustrated in FIG. 5A).

Figure 4B:
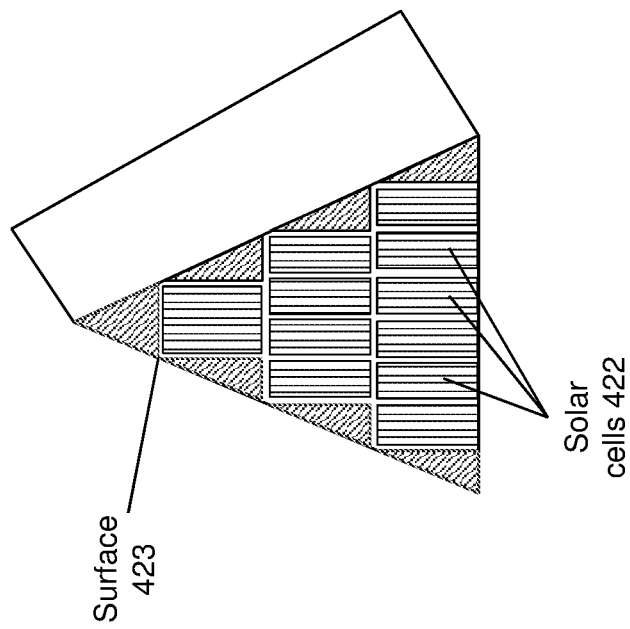
FIG. 4B illustrate exemplary solar cell unit configured with a triangular shape.

FIG. 4B illustrates an exemplary solar cell unit including a plurality of solar cells configured to form a triangular shape. Solar cell unit 421 can include a plurality of solar cells 422. Each solar cell 422 can be located on surface 423. In some examples, the plurality of solar cells 422 can be configured with any shape, such as rectangular or triangular, as illustrated in the figure. In some examples, the plurality of solar cells 422 can be fabricated on the same substrate. In some examples, the plurality of solar cells 422 can be fabricated on different substrates, and optionally, can be adhered together. In some examples, solar cell unit 421 can include one or more gaps between solar cells 422. In some examples, inner edges of each solar cell 422 can be in close proximity or in contact with inner edges of other solar cells 422 to increase the overall footprint of the photovoltaic material on surface 423. In some examples, one or more solar cells 422 can be electrically connected together. In some examples, the solar cells can be electrically coupled together using one or more switches or a switching matrix. In some examples, solar cell unit 421 can be mounted to one or both of the triangular faces of a support structure (e.g., support structure 320 illustrated in FIG. 3A or support structure 520 illustrated in FIG. 5A).

Figure 4C:
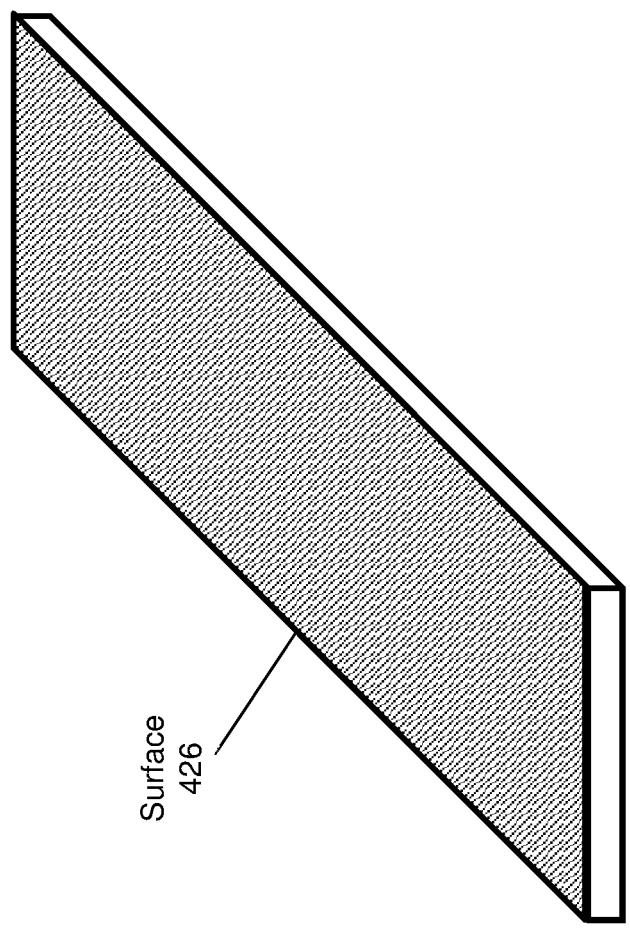
FIG. 4C illustrates an exemplary rectangular-shaped solar cell.

FIG. 4C illustrates an exemplary rectangular-shaped solar cell. Solar cell 424 can include surface 426, which can include one more photovoltaic materials configured to absorb sunlight and convert the absorbed light into electricity. Solar cell 424 can be any type of solar cell including, but not limited to, silicon-based (e.g., single crystal silicon or polycrystalline silicon) solar cells or thin film solar cells (i.e., solar cells comprising a plurality of layers of one or more thin film photovoltaic materials). In some examples, solar cell 424 can include the same material as solar cell 422 (illustrated in FIG. 4A) or solar cell unit 421 (illustrated in FIG. 4B). In some examples, solar cell 424 can be mounted on the inside rectangular face of a support structure (e.g., surface 534 illustrated in FIG. 5A). Solar cells 424 can be configured along the long axis of a support rod (e.g., rod 234 illustrated in FIGS. 2A and 2B or rod 634 illustrated in FIG. 6B) to reduce horizontal surface area.

Figure 4D:
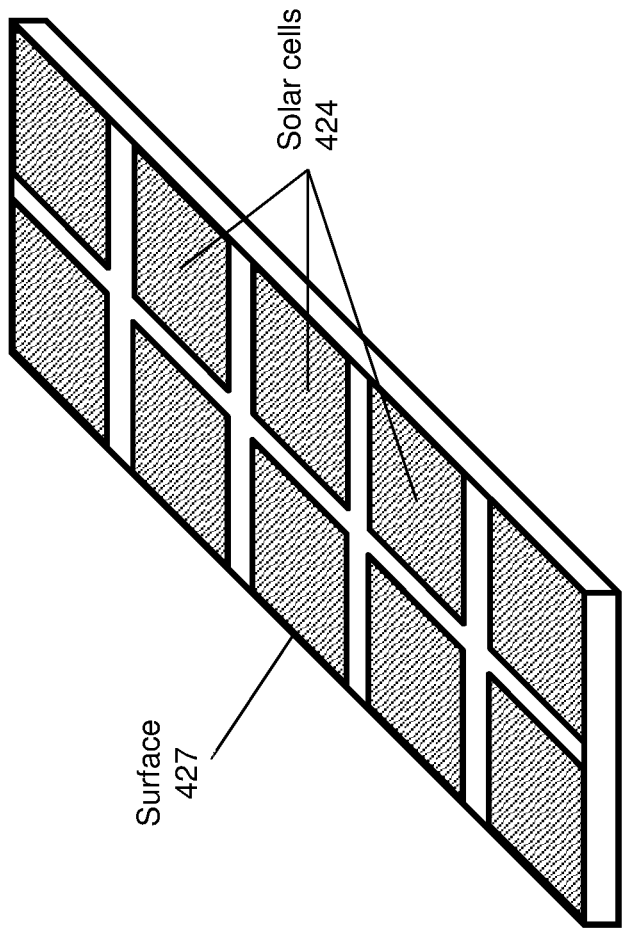
FIG. 4D illustrate exemplary solar cell unit configured with a rectangular shape.

FIG. 4D illustrates an exemplary solar cell unit including a plurality of solar cells configured to form a rectangular shape. Solar cell unit 425 can include a plurality of solar cells 424. Each solar cell 424 can be located on surface 427. In some examples, the plurality of solar cells 424 can be configured with any shape, such as rectangular. In some examples, at least two of the plurality of solar cells 424 can have different dimensions. In some examples, at least two of the plurality of solar cells 424 can include one or more photovoltaic materials. In some examples, the plurality of solar cells 424 can be fabricated on the same substrate. In some examples, the plurality of solar cells 424 can be fabricated on different substrates, and optionally, can be adhere together. In some examples, solar cell unit 425 can include one or more gaps between solar cells 424. In some examples, inner edges of each solar cell 424 can be in close proximity or in contact with inner edges of other solar cells 424 to increase the overall footprint of the photovoltaic material on surface 427. In some examples, one or more solar cells 424 can be electrically connected together. In some examples, the solar cells can be electrically coupled together using one or more switches or a switching matrix.

In some examples, solar cell unit 425 can be mounted to one or both of the triangular faces of a support structure (e.g., support structure 320 illustrated in FIG. 3A or support structure 520 illustrated in FIG. 5A). In some examples, solar cell unit 425 can be mounted to a rectangular surface of a support structure (e.g., surface 534 of support structure 520 illustrated in FIG. 5A). In some examples, solar cells 424 can be mounted to the inner face of a support structure. In some examples, solar cells 424 can be mounted to one or more external faces of a support structure.

In some examples, the absorbing surface of the solar cells can be textured and/or patterned. The textures and/or patterns can be configured to increase efficiency of the solar panel system by preventing photons from escaping and to keep the photons bouncing within the photovoltaic surfaces. In some examples, the solar cells may also be curved to retain photons bouncing in the photovoltaic surface. In some examples, the substrate that the solar cells are mounted on can be curved and/or flexible.

b) Prism Support Structure

The support structure included in the solar cell system can be configured to provide structural support for the solar cells. In some examples, the support structure can be configured as a mounting surface for the solar cells. In some examples, a support structure can be a triangular prism having triangular faces and rectangular faces. In some examples, the at least one solar cell can be mounted on at least one of the triangular faces of the triangular prism support structure. In some examples, the at least one solar cell can be mounted on at least one of the rectangular faces of the triangular prism support structure. In some examples, at least one solar cell can be mounted on at least one of the triangular faces of the triangular prism support structure and another solar cell can be mounted on at least one of the rectangular faces of the triangular prism support structure.

FIG. 5A illustrates an exemplary support structure. Support structure 520 can include surface 532 and surface 534. Surface 532 and/or surface 534 can include one or more solar cells. In some examples, surface 532 can include a triangular-shaped solar cell (e.g., solar cell 422 illustrated in FIG. 4A) or a triangular-shaped solar cell unit (e.g., solar cell unit 421 illustrated in. FIG. 4B). In some examples, surface 534 can include a rectangular-shaped solar cell (e.g., solar cell 424 illustrated in FIG. 4C) or a rectangular-shaped solar cell unit (e.g., solar cell unit 425 illustrated in FIG. 4D). In some examples, the solar panel system can be oriented such that surface 532 is facing the sun. In some examples, the solar panel system can be, additionally or alternatively, oriented such that surface 534 is facing a support rod (e.g., rod 234 illustrated in FIGS. 2A and 2B or rod 634 illustrated in FIG. 6B).

Figure 5B:
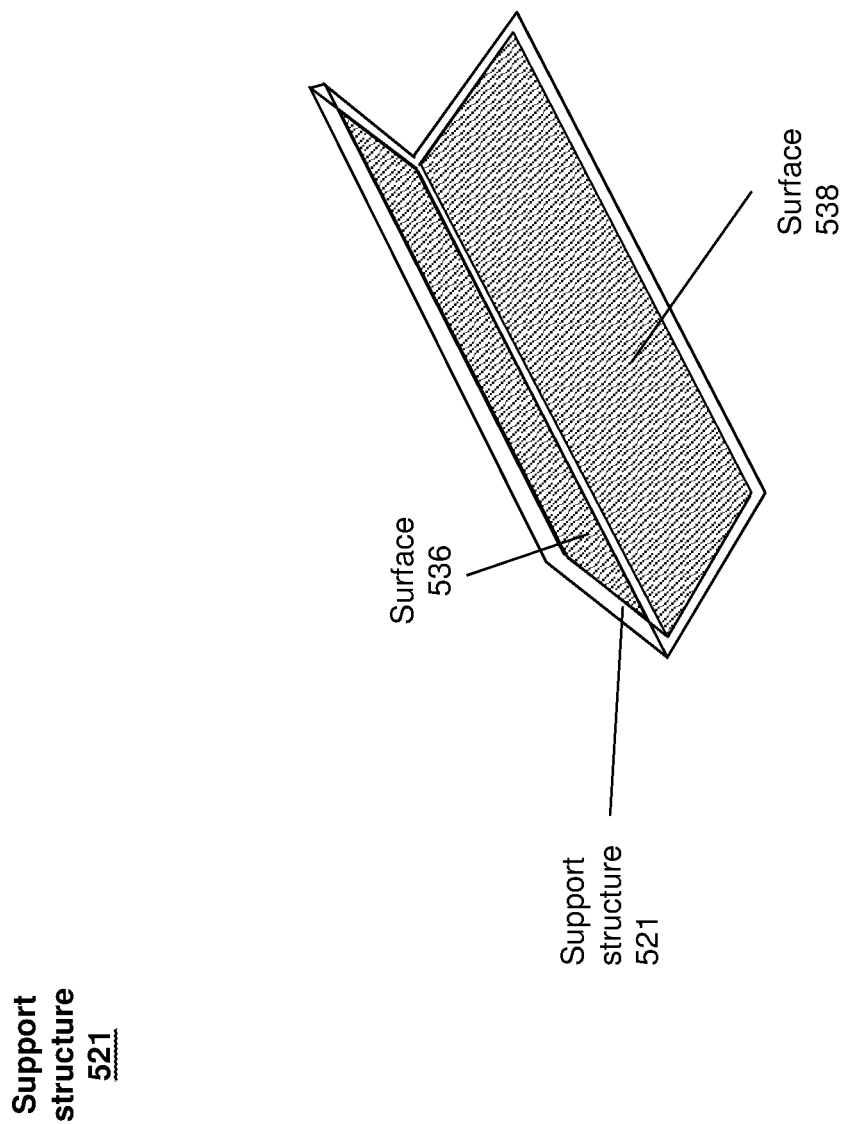

FIG. 5B illustrates an exemplary support structure. Support structure 521 can include a plurality of surfaces, such as surface 536 and surface 538. Surface 536 and/or surface 538 can include one or more solar cells. In some examples, surface 536 and/or surface 538 can include a rectangular-shaped solar cell (e.g., solar cell 424 illustrated in FIG. 4C) or a rectangular-shaped solar cell unit (e.g., solar cell unit 425 illustrated in FIG. 4D). In some examples, the solar panel system can be oriented such that surface 536 and surface 538 are directed towards a support rod (e.g., rod 234 illustrated in FIGS. 2A and 2B or rod 634 illustrated in FIG. 6B). In some examples, the substrate of surface 536 and/or substrate of surface 538 can include a reflective material, such as aluminum or silver. The reflective material can be configured to reflect, redirect, focus, and/or concentrate light incident on the absorbing surface of the solar cells. In some examples, surface 536 and surface 538 can be oriented at angle with respect to each other, including, but not limited to, 45°, 60° or 90°.

In some examples, support structures can include a light-filtering material or a color filter device such that only particular wavelengths or bands of wavelengths can reach the solar cells (e.g., solar cells 322 and solar cells 324). In some examples, a holographic film may be used to reduce the amount of silicon in the solar panel system. The holographic film may comprise several gelatin-on-PET plastic layers. Each film can be imprinted with a holographic optical element. These elements can diffract wavelengths that can be converted to energy by the solar cells. Wavelengths of sunlight that cannot be converted by the solar cells can be allowed to pass through the film and layers and/or support structure, rather than being absorbed and converted to heat. This spectral selection feature can keep the solar cells operating close to their ideal temperature curve without mechanical cooling. A person of ordinary skill in the art will easily recognize that strategies consisting in filtering light so that the cells are exposed to optimal wavelength have been widely described, and therefore are enclosed within the spirit and scope consistent with the claims.

In some examples, the solar panel units may be repositionable so that they can detect when they are in the shade and be repositioned to maximize sun exposure. The automatic shade detection and repositioning can minimize shade exposure to prevent damage. The solar panel system may include sensors and actuators to allow shade detection and movement to rotate the solar panel system to a better position. In some examples, the solar panel system as a whole may be repositionable, such as a system, whereby the cylindrical outer casing to which the solar panel system components are secured can be capable of repositioning.

c) Cylindrical Outer Casing

Figure 6A:
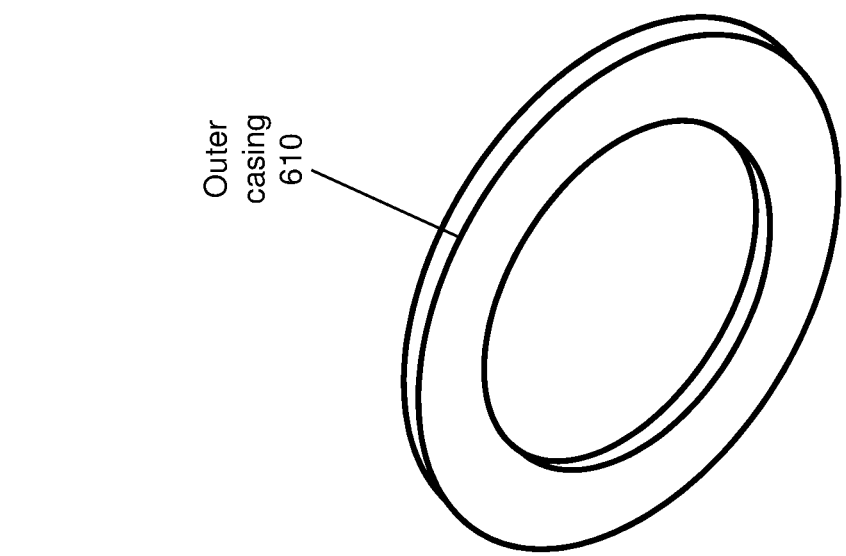
FIG. 6A illustrates an exemplary cylindrical outer casing.

FIGS. 6A and 6B depict an exemplary structure in which the solar panel system components can be secured to or supported by. The structure can include cylindrical outer casing 610, as shown in FIG. 6A. In some examples, cylindrical outer casing 610 can include a conductive metal. In some examples, the conductive metal can be configured as a heat sink. In some examples, cylindrical outer casing 610 can include a transparent material, such as glass or plastic, to allow sunlight to pass through the material to reach solar cells, e.g., if positioned within the casing. In some examples, cylindrical outer casing 610 can include an insulating material. In some examples, cylindrical outer casing can be configured to support or provide an attachment location for one or more solar cells. In some examples, the cylindrical outer casing 610 can include a handle attached thereto. Cylindrical outer casing 610 can possess an inner radius, an outer radius, a radial thickness, and an axial thickness. In some examples, cylindrical outer casing 610 can include connections to a controller or processor, wherein the controller can be configured to control or communicate the automatic shade detection features and repositioning of the solar panel system.

d) Radial Support Structure

The structure can also include radial support structure 630, as shown in FIG. 6B. The radial support structure can be configured to connect different parts of the solar panel system to a rod. In some examples, the radial support structure can comprise a plurality of support panels and a rod, wherein the plurality of support panels can be radially configured around the rod, and wherein the plurality of solar panel units can be mounted onto the plurality of support panels. In some examples, support structure 630 can be star-shaped.

FIG. 6B depicts a top view of an exemplary star-shaped radial support structure 630. Support structure 630 can comprise support panels 632 and rod 634. Support panels 632 can be configured to support the solar cells. In some examples, the absorbing surface of the solar cells can be oriented parallel to the view illustrated in the figure. The number of individual support panels in the star-shaped radial support structure can vary, e.g., from two, three, four to 12, or more. In some examples, support panels 632 can be triangular-shaped. In some examples, support panels can be rectangular-shaped or of any other shape. In some examples, support panels may be made of a conductive material or in some examples made of an insulating material.

The radial support structure 630 can further comprise rod 634. In some examples, the support panels 632 can be securely connected or attached to rod 634. Each support panel 632 can be attached to rod 634 at any location. In some examples, support panels 632 can be uniformly positioned (e.g., spaced) around or attached to rod 634. Rod 634 may comprise a conductive material or any other metal. In some examples, rod 634 can comprise an insulating material. In some examples, support panels 632 and rod 634 can include the same material(s). Rod 634 can be placed at the center of the solar panel system and/or radial support structure and may be used to secure the system to a grounding, holding or positioning device (e.g., device 140 illustrated in FIG. 1). In some examples, the cylindrical rod 634 may be a hollow cylinder. In some examples, the hollow cylinder can be used to route connections to the solar cells to electrical connections or wires from the plurality of solar cells attached to or supported by support panels 632. In some examples, the cylindrical rod 634 can be one solid continuous piece of material. The radial support structure 630 can comprise one continuous piece of material or can comprise individual support panels 632 that are securely connected to the rod 634. In some examples, cylindrical rod 634 can protrude from one or both side of the solar panel system and be configured as a stake to secure the system on the around or to allow the system to be connected to a grounding, holding or positioning device (e.g., device 140 illustrated in FIG. 1).

e) Additional Components of Solar Panel System

In some examples of the solar panel systems described herein, the solar panel unit can also include metallic sheets with slits. The metallic sheets can be placed on the inner faces support structures (e.g., surface 534 of support structure 520 illustrated in FIG. 5A).

Figure 7A:
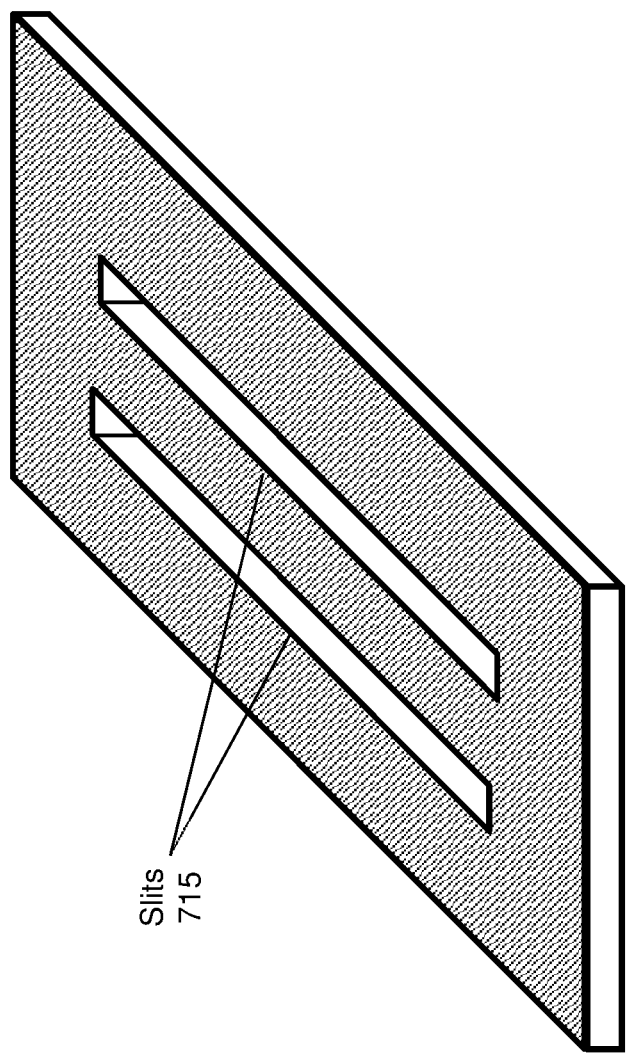
FIG. 7A illustrates an exemplary metallic sheet with slits.

FIG. 7A illustrates an exemplary metallic sheet with slits. Metallic sheet 714 can include a plurality of slits 715. Plurality of slits 715 can be configured to allow light to pass through and/or selectively filter one or more wavelengths or bands of wavelengths. Metallic sheet 714 can be oriented such that slits 715 run parallel to the long axis of the rod (e.g., rod 234 illustrated in FIGS. 2A and 2B or rod 634 illustrated in FIG. 6B), support structure (e.g., support structure 220 illustrated in FIG. 2A), or both. Metallic sheet 714 can, for example, replace or be located proximately and in addition to one or more solar cells (e.g., solar cell 224 illustrated in FIG. 2A). Although the figure illustrates two slits included in the metallic sheet, examples of the disclosure can include any number of slits. In some examples, metallic sheet 714 can include one or more slits 715 that have one or more properties (e.g., shape, size, location) that are different from other slits 715. Although the figure illustrates the slits with rectangular openings, examples of the disclosure can include slits with any shapes and/or sizes.

Figure 7B:
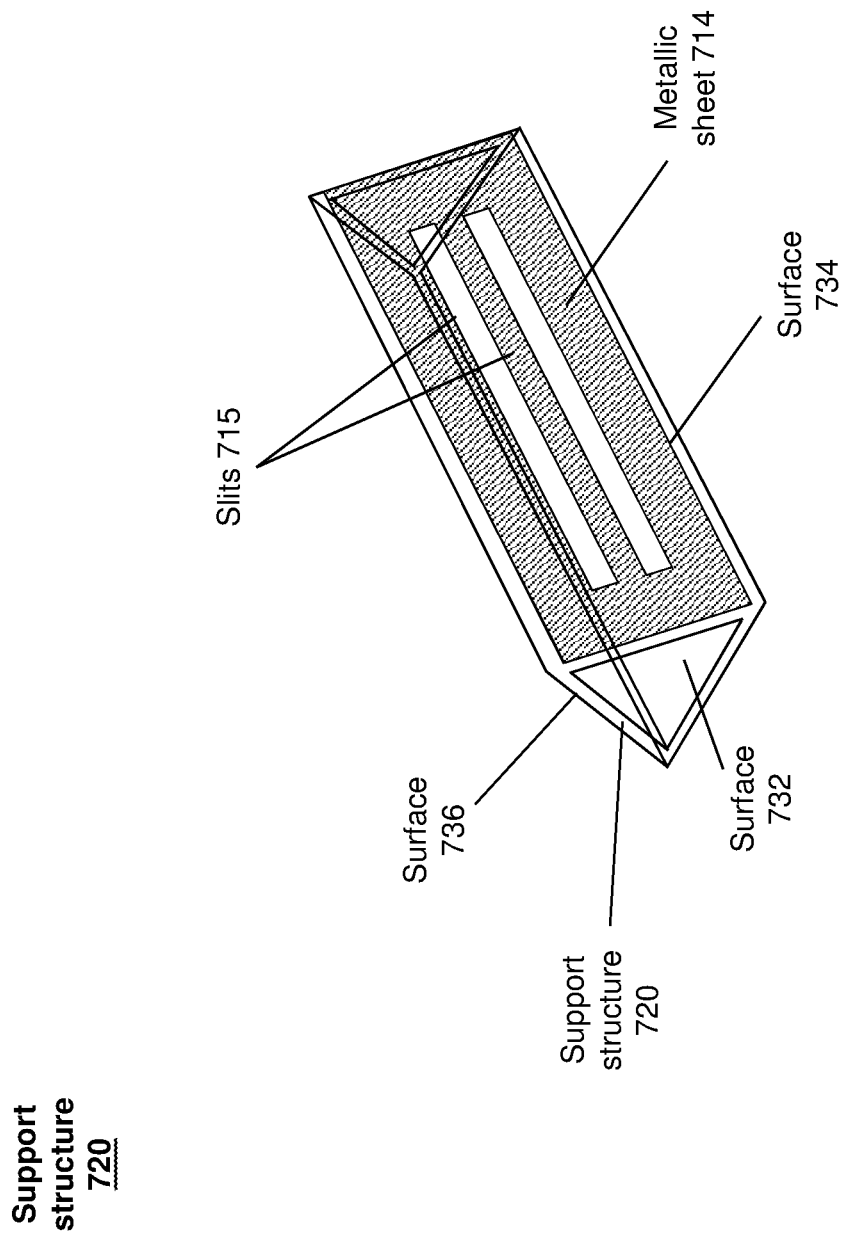
FIG. 7B illustrates an exemplary support structure with a metallic sheet with slits.

In some examples, one or more surfaces of the support structure can include metallic sheet 714. FIG. 7B illustrates an exemplary support structure including a metallic sheet. Solar panel unit 704 can include support structure 720 and metallic sheet 714. Support structure 720 can include a plurality of surfaces, such as surface 732, surface 734, and surface 736. Metallic sheet 714 can be attached to, embedded within, supported by, and/or in contact with surface 734 of support structure 720. In some examples, metallic sheet 714 can partially form support structure 720. In some examples, metallic sheet 714 can be supported by, attached to, in contact with, or provide support to the radial support structure (e.g., support structure 630 illustrated in FIG. 6B). Metallic sheet 714 can be oriented such that slits 715 run parallel to the long axis of the rectangular faces of support structure 720. In some examples, solar panel unit 704 can include metallic sheet 714 located on one surface, such as surface 734, of the support structure 720 and one or more solar cells located on the other surface(s), such as surface 736, of the support structure 720. In some examples, the absorbing surfaces of the one or more solar cells can be facing slits 715. In some examples, metallic sheet 714 can include one or more solar cells on one or both sides.

f) Curved Solar Panel Units

Figure 8:
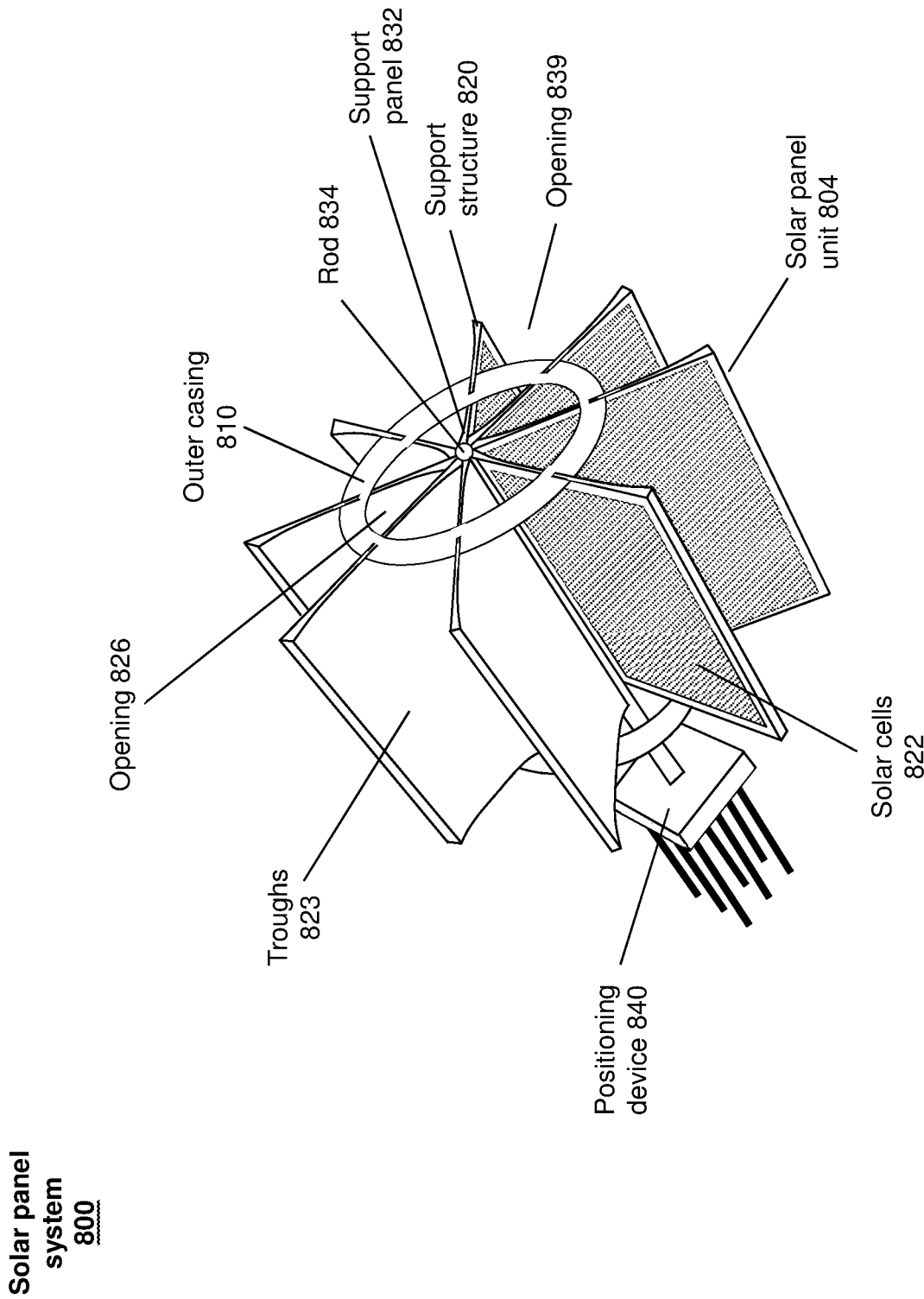
FIG. 8 illustrates an exemplary solar panel system.

In some examples, the solar panel system may include curved solar panel units. FIG. 8 illustrates an exemplary solar panel unit. Solar panel system 800 can include a plurality of solar panel units 804, at least one outer casing 810, and a rod 834. Plurality of solar panel units 804 can be supported by, attached to, or held together by the plurality of outer casings 810. Each solar panel unit 804 can include one or more solar cells 822. Solar cells 822 can be any type of solar cells including, but not limited to, silicon-based (e.g., single crystal silicon or polycrystalline silicon) solar cells or thin film solar cells (i.e., solar cell comprising a plurality of layers of one or more thin film photovoltaic materials). Each solar cell can have one or more electrical connections, where the generated electricity can be drawn. In some examples, solar cells 822 can be electrically connected together to form solar panel unit. In some examples, solar cells 822 can be electrically coupled together using one or more switches or a switching matrix (not shown). In some examples, the one or more switches or switching matrix can be included, in part or entirely, in support structures 820, outer casings 810, rod 834, or a combination thereof.

Each solar panel unit 804 can further include support structure 820 that can provide structural support or a surface to mount solar cells 822. In some examples, solar cells 822 can be supported by a substrate. In some examples, the substrate can be a single substrate that the solar cells are formed on. In some examples, the support can include multiple substrates coupled or adhered together. In some examples, the substrate can include a transparent material, such as a glass, plastic, or PET. A transparent material can allow light that is not absorbed by one solar cell 822 to be absorbed by other solar cells 822. In some examples, the substrate can include a reflective material, such as aluminum or silver, to reflect, redirect, focus, and/or concentrate the light incident on the surface of the solar cells 822.

In some examples, solar panel system 800 can include curved solar panel units 804. Solar panel units 804 can include support structure 820 configured as troughs 823. Troughs 823 can be any shape, including, but not limited to, parabolic-shaped and circular-shaped. Troughs 823 can be configured to redirect, collect, focus, and/or concentration incident light rays towards solar cells 822. The curved solar panel units 804 may be parabolic-shaped or circular-shaped troughs that are mounted to or over the solar cells 822. In some examples, solar panel system 800 can include parabolic-shaped solar cells and a trough coated with a reflective metal to focus light as a diagonally positioned light-splitting structure. When sunlight hits the trough 823, light can scatter and be directed to filters (not shown). The filters can allow only particular wavelengths or bands of wavelengths of light to pass through to the solar cells 822 and reflect the remaining wavelengths either away from or toward other filters. In some examples, a metallic sheet with slits (e.g., metallic sheet 714 illustrated in FIG. 7A) can be employed as a filter. In this configuration, the solar cells can be optimized to only absorb specific wavelengths of light. This can allow the solar cells to be more efficient in producing electricity.

In some examples, plurality of solar cells 822 can be oriented such that the absorbing surfaces of plurality of solar cells 822 are substantially parallel to the sun. In some examples, one or more solar panel units can have at least one curved surface. In some examples, the curved surface can be used to increase the number of light rays from the sun incident on the surface. In some examples, the curved surface can be used for aesthetic purposes. In some examples, the curved surface can be convex, as shown in the figure. In some examples, the curved surface can be concave (not shown). In some examples, one or more solar panel units can include a plurality of solar cells 822 located on one side of the solar panel unit. In some examples, one or more solar panel units can include a plurality of solar cells 822 located on both sides of the solar panel unit.

Outer casing 810 can be connected to a radial support structure comprising support panels 832 and rod 834. Support panels 832 can each be connected to rod 834, and outer casing 810 can optionally include one or more notches or attachment locations to hold support panels 832 in a radial configuration around rod 834. In some examples, outer casing 810 can be connected to rod 834. Support panels 832 can be connected to rod 834 such that a plurality of openings 826 can be formed. Plurality of openings 826 can be configured such that light rays from the sun can enter through plurality of openings 826 and can travel to reach the absorbing surfaces of plurality of solar cells 822. In some examples, light rays from the sun can, additionally or alternatively enter through plurality of openings 839.

Rod 834 can also be connected to a grounding, holding, or positioning device 840. In some examples, rod 834 can be used to route electrical. connections or wires from the plurality of solar cells 822 to a generator, power supply, battery, end-device, or the like. In some examples, additionally or alternatively, outer casing 810 can be used to route electrical connections or wires from the plurality of solar cells 822. In some examples, additionally or alternatively, one or more support panels 832 can be used to route electrical connections or wires from the plurality of solar cells 822.

Solar panel system 800 can be mounted or configured such that at least one outer casing 810 is oriented directly facing the sun. As a result, the horizontal space occupied by solar panel system 800 can be reduced when the total absorbing surface area of solar panel units is greater than the footprint. In this manner, the footprint of the solar panel system can be reduced without compromising efficiency and/or amount of collected light rays. In some examples, positioning device 840 can be configured to rotate solar panel system 800. Positioning device 840 can include or can be coupled to a processor or controller. The processor or controller can rotate solar panel system 100 to exchange solar panel units.

The solar panel units of the solar panel system detailed herein may be electrically connected to a battery, generator or other device, which can receive an electrical charge from the solar cells. The solar panel system may thus be configured with electrical wiring or other components known to those of skill in the art to provide electrical power. The battery, generator or other device may be connected, either directly or indirectly to a load for which electricity is desired. Thus, in some examples, a solar panel system can comprise solar panel units, as provided herein, and a battery, generator, or other device electrically connected to the solar panel system thereby receiving an electrical charge from the solar cells, and configured to provide electrical power to a load electrically connected to the battery, generator or other device.

Figure 9:
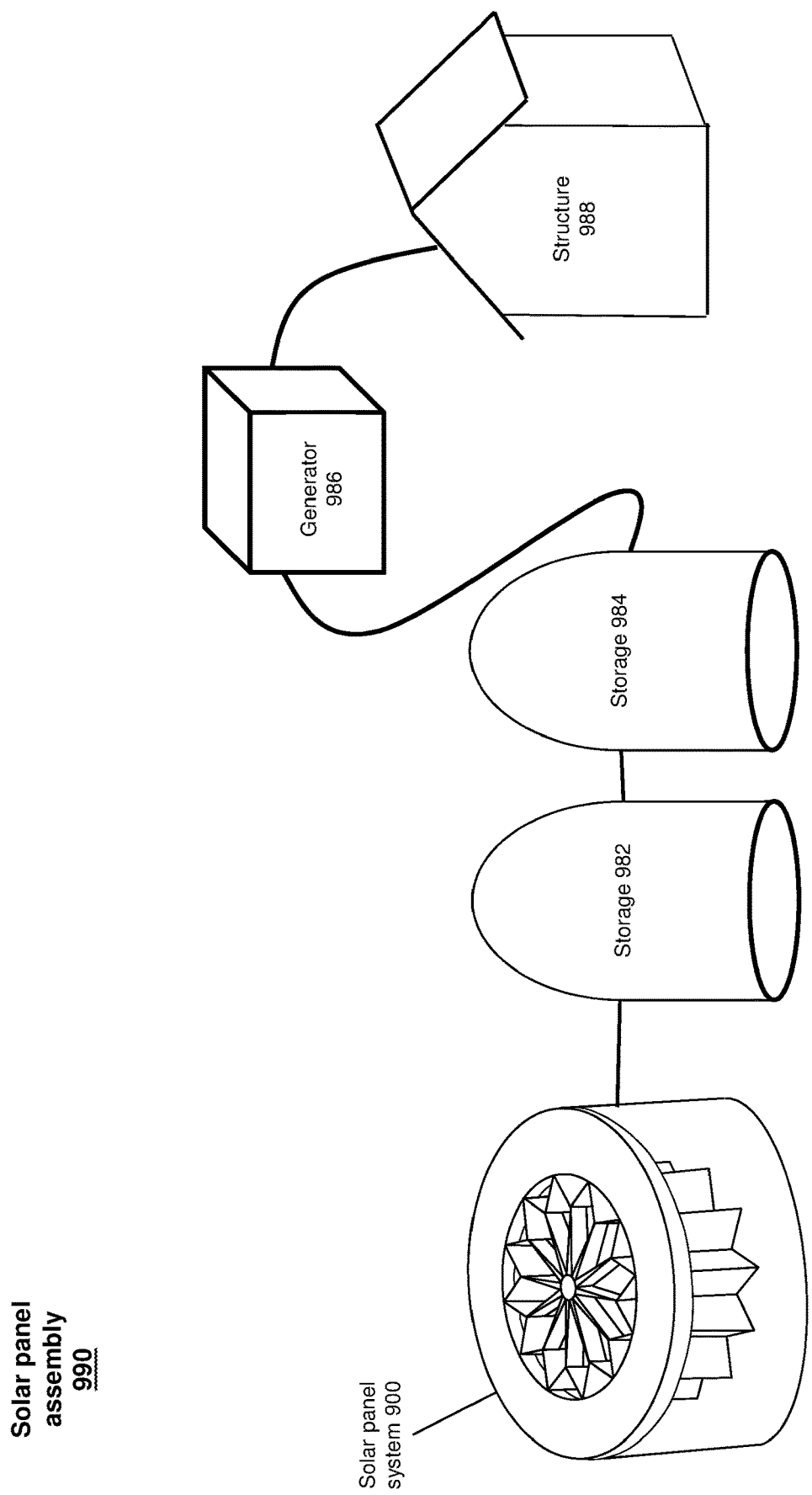
FIG. 9 illustrates an exemplary solar panel assembly.

FIG. 9 illustrates an exemplary solar panel assembly. Solar panel assembly 990 can include solar panel system 900, storage 982, storage 984, generator 986, and structure 988. Solar panel system can convert incident light rays into an electrical current, which can be transported to storage 982. Storage 982 can be configured to store electrical energy. Storage 982 can be connected to storage 984. Storage 984 can be connected to generator 986, which can be configured as provide power to structure 988. In some examples, storage 982 can be a high pressure storage unit, and storage 984 can be a low pressure storage unit. Solar panel assembly 990 can be configured to fill up storage 982 with electrical energy from solar panel system 900, while storage 984 releases energy into generator 986. Due to the pressure difference between storage 982 and storage 984, electrons from storage 982 can flow kinetically from a state of high potential energy to storage 984, which can have a state of low potential energy. In this manner, uniform power can be supplied to structure 988 both when solar power system 900 is exposed to low levels of solar energy (e.g., at night) and high levels of solar energy (e.g., during the day).

Thus, in some examples, the solar panel system includes a battery bank. In some examples, the solar panel system is connected to a solar tracking device.

In yet some examples, since the solar panel systems described herein may be portable systems, the solar panel system comprises a handle in order to facilitate transportation.

Additionally, in some examples, two or more solar panel systems as described herein can be connected together in order to increase efficiency.

Various exemplary examples are described herein. Reference is made to these examples in a non-limiting sense. They are provided to more broadly illustrate applicable aspects of the disclosed technology. Various changes may be made and equivalents may be substituted without departing from the true spirit and scope of the various examples. In addition, many modifications may be made to adapt a particular situation, material, composition of matter, process, process act(s), or step(s) to the objective(s), spirit, or scope of the various examples. Further, as will be appreciated by those with skill in the art, each of the individual variations described and illustrated herein has discrete components and features that may be readily separated from or combined with the features of any of the other several examples without departing from the scope or spirit of the various examples.

In some examples, the solar panel systems provided herein can be used for providing electrical power to an electrical device using any of the solar panel system described herein. In additional examples, the solar panel systems provided herein can be used for charging a battery using any of the solar panel system described herein. In some examples, the solar panel systems provided herein can be used for generating alternative current using any of the solar panel system described herein. In some examples, the solar panels system provided herein can be used for generating direct current using any of the solar panel system described herein.

What is claimed is:

1. A solar panel system comprising:
   a plurality of solar panel units, wherein each solar panel unit comprises at least one solar cell and a prism support structure, and wherein at least one solar cell is mounted on one surface of the prism support structure;
   a radial support structure comprising a plurality of support panels and a rod, wherein the plurality of support panels are radially configured around the rod, and wherein the plurality of solar panel units are mounted onto the plurality of support panels;
   at least one cylindrical outer casing;
   a positioning device configured to rotate the solar panel system;
   wherein the plurality of solar panel units are arranged around the radial support structure,
   wherein the at least one cylindrical outer casing is in direct physical contact with the plurality of prism support structures and is configured to support the arrangement of the plurality of solar panel units around the radial support structure, and
   wherein the solar panel units are circumscribed within the volume defined by the outer radius of the at least one cylindrical outer casing.

2. The solar panel system of claim 1, wherein the at least one cylindrical outer casing comprise a transparent material allowing light to pass through the at least one cylindrical outer casing.

3. The solar panel system of claim 1, wherein the rod comprises an insulating material.

4. The solar panel system of claim 1, wherein the rod is a hollow cylinder.

5. The solar panel system of claim 1, wherein the radial support structure comprises a conductive material.

6. The solar panel system of claim 1, wherein the radial support structure is a single continuous piece of material.

7. The solar panel system of claim 1, wherein the number of support panels of the plurality of support panels ranges from 2 to 12 or is more than 12.

8. The solar panel system of claim 1, wherein the solar panel units are configured radially around the long axis of the rod.

9. The solar panel system of claim 1, wherein the solar panel units are configured perpendicular to the long axis of the rod.

10. The solar panel system of claim 1, wherein the solar panel units are configured along the long axis of the rod.

11. The solar panel system of claim 1, wherein at least one solar cell is flat.

12. The solar panel system of claim 1, wherein the prism support structure is a triangular prism support structure having triangular faces and rectangular faces.

13. The solar panel system of claim 12, wherein the triangular prism support structures filter specific wavelengths of light.

14. The solar panel system of claim 12, wherein the at least one solar cell mounted on one surface of the prism support structure is mounted on at least one of the triangular faces of the triangular prism support structure.

15. The solar panel system of claim 12, wherein the at least one solar cell mounted on one surface of the prism support structure is mounted on at least one of the rectangular faces of the triangular prism support structure.

16. The solar panel system of claim 12, wherein one of the at least one solar cell mounted on one surface of the prism support structure is mounted on at least one of the triangular faces of the triangular prism support structure and another one of the at least one solar cell mounted on one surface of the prism support structure is mounted on at least one of the rectangular faces of the triangular prism support structure.

17. The solar panel system of claim 1, wherein the prism support structure comprises one or more slits to filter wavelengths of light.

* * * * *